United States Patent
Shroff et al.

(10) Patent No.: US 6,515,343 B1
(45) Date of Patent: Feb. 4, 2003

(54) METAL-TO-METAL ANTIFUSE WITH NON-CONDUCTIVE DIFFUSION BARRIER

(75) Inventors: Mehul D. Shroff, Cupertino, CA (US); Rajiv Jain, Palo Alto, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 09/196,946

(22) Filed: Nov. 19, 1998

(51) Int. Cl.[7] .............................................. H01L 29/00
(52) U.S. Cl. .................. 257/530; 257/50; 257/529; 438/131; 438/467
(58) Field of Search .................. 257/530, 50, 758, 257/529; 438/131, 467, 600, 957

(56) References Cited

U.S. PATENT DOCUMENTS

| | | | |
|---|---|---|---|
| 5,557,136 A | * 9/1996 | Gordon et al. | 257/530 |
| 5,602,053 A | 2/1997 | Zheng et al. | 437/60 |
| 5,705,849 A | * 1/1998 | Zheng et al. | 437/60 |
| 5,986,322 A | * 11/1999 | McCollum et al. | 257/530 |
| 6,037,664 A | * 3/2000 | Zhao et al. | 257/758 |
| 6,124,193 A | 9/2000 | Hawley et al. | 438/600 |
| 6,133,619 A | * 10/2000 | Sahota et al. | 257/649 |
| 6,326,300 B1 | 12/2001 | Liu et al. | 438/638 |
| 6,362,023 B1 | 3/2002 | Bergemont et al. | 438/131 |

OTHER PUBLICATIONS

R.L. Jackson et al., "Processing and integration of copper interconnects", Mar. 1998, Solid State Technology, pp. 49–50, 54, 56 and 59.

T.J. Licata et al., "Interconnect fabrication processes and the development of low–cost wiring for CMOS products", IBM J. Res. Develop., vol. 39, No. 4, Jul. 1995, pp. 419–435.

B. Roberts et al., "Interconnect metallization for future device generations", Feb. 1995, Solid State Technology, pp. 69–78.

S. W. Russell, et al., "Integration Challenges of Ultra Low–K Dielectrics", pp. 32–43.

* cited by examiner

Primary Examiner—Steven Loke
Assistant Examiner—Donghee Kang
(74) Attorney, Agent, or Firm—Skjerven Morrill LLP

(57) ABSTRACT

An antifuse is disposed between a first and second conductor. An insulating diffusion barrier (for example, silicon nitride) covers the sidewalls of the antifuse to inhibit contaminants (for example, copper, chlorine, fluorine, sodium, potassium, and moisture) from diffusing laterally into the antifuse from the interlayer dielectric, where a damascene copper conductor and/or a low-k dielectric is used. In a damascene antifuse structure, the insulating diffusion barrier layer covers an upper surface of the damascene conductor that is not covered by the antifuse. This insulating diffusion barrier layer inhibits copper from diffusing up into an interlayer dielectric and then diffusing laterally into the antifuse.

21 Claims, 9 Drawing Sheets

METAL-TO-METAL ANTIFUSE WITH NON-CONDUCTIVE DIFFUSION BARRIER

BACKGROUND INFORMATION

The metal interconnect of integrated circuits has conventionally been realized by blanket depositing a layer of metal on a substantially planar insulating surface. Portions of the metal layer are subsequently removed in an etching step to form the resulting metal conductors. Copper is preferred due to lower resistivity and better electromigration resistance. Unfortunately, copper is difficult to etch in such a process. Conventional integrated circuits have therefore generally employed a more resistive metal, aluminum, for the metal interconnect.

More recently, a "damascene" process has been developed whereby copper can be used as the interconnect metal. Rather than blanket depositing the interconnect metal on a substantially planar insulating substrate and then etching away parts of the metal layer to leave the conductors, trenches are formed in an insulating material. A layer of interconnect metal is then blanket deposited over the entire surface of the insulating substrate such that the trenches are filled. Chemical mechanical polishing is then used to planarize the integrated circuit surface and thereby polish away all the metal that is not in the trenches. The result is metal conductors disposed in trenches. The term "damascene" derives from the name of the city Damascus. In antiquity, art objects were allegedly decorated in Damascus in similar fashion by embedding precious metals into grooves in their surfaces.

FIGS. 1 and 2 (Prior Art) are cross-sectional diagrams of a damascene antifuse structure from U.S. Pat. No. 5,602,053. Damascene conductor 50 can be permanently coupled to damascene conductor 130 by programming antifuse stack 42–45. Layers 43 and 45 in antifuse stack 42–45 are amorphous silicon, while layers 42 and 44 are silicon nitride. The antifuse stack 42–45 overhangs the underlying damascene conductor 130 by a small amount. A neighboring damascene conductor 61, shown in FIG. 2, has no overlying antifuse but rather has a capping diffusion barrier layer 60 that acts to prevent copper from diffusing up into the insulating material 41 from damascene conductor 61. In U.S. Pat. No. 5,602,053, the conductors 50 and 130 are called "dual damascene" conductors because they each include a narrow vertically extending neck or conductive plug portion as well as an overlying and wider horizontally extending conductor portion.

As shown in FIGS. 1 and 2, antifuse stack 42–45 is wider than the underlying damascene conductor 130, which is necessary to prevent copper from diffusing into insulating material 41 and then into the sidewalls of antifuse stack 42–45. Unfortunately, the increased width of antifuse stack 42–45 causes increased leakage and higher capacitance.

Conventional dual damascene technology includes barriers that prevent copper from diffusing into the interlayer dielectric. As shown in FIGS. 1 and 2, antifuse stack 42–45 itself is used as a barrier to prevent diffusing of copper from conductor 130 into insulating material 41. However, these barriers do not prevent impurities from the interlayer dielectric from diffusing into the sidewalls of antifuse stacks 42–45.

Other metals conventionally used in antifuse technology, such as aluminum, tungsten, titanium tungsten, and titanium nitride, have very little diffusion into the standard interlayer dielectric, such as silicon dioxide or TEOS (tetraethyl-orthosilicate). Moreover, TEOS is free of contaminants that could diffuse into the antifuse and degrade performance. Conventionally, antifuses are protected from contaminants with the use of TEOS as an interlayer dielectric. Thus, in conventional antifuse technology there is no need for a barrier to prevent diffusion from the metals into the interlayer dielectric or to prevent diffusion of contaminants from the interlayer dielectric into the antifuse.

However, standard antifuse technology using aluminum type conductors is moving toward lower dielectric constant ("low-k") insulators between metal lines and also between metal layers. A "low-k" (low permitivity) material is a class of materials that have dielectric constants of less than 4.0 and preferably equal to or less than 3.5. "Low-k" materials, for example, may be fluorine and/or chlorine containing polymers. These materials may have their own contaminants such as mobile potassium and sodium ions. Further, "low-k" materials may be a weak barrier to contaminant diffusion.

Ultimately, both these directions are expected to be unified with the use of copper as the interconnect metal and a "low-k" dielectric between metal lines and/or layers.

Contaminants, such as copper or impurities, that pass into the antifuse may deleteriously affect antifuse electrical characteristics and/or reliability. Thus, an improved antifuse structure is desired that prevents diffusion of contaminants into the antifuse in both standard metal antifuse architecture as well as in damascene antifuse structures. It is desired to inhibit contaminants (for example, copper) from a damascene conductor from diffusing into the interlayer dielectric and then into the sidewalls of the programmable material in the antifuses. It is also desired to inhibit impurities (for example, fluorine, chlorine, potassium, and sodium ions) that may be present in the interlayer dielectric from diffusing into the sidewalls of the programmable material in the antifuses.

SUMMARY

An antifuse structure with an exposed amorphous silicon sidewall includes a diffusion barrier layer, such as silicon nitride or silicon oxynitride, that is deposited on the antifuse sidewall to prevent impurities from diffusing into the antifuse programmable material.

In an embodiment of an antifuse structure using damascene conductors, an antifuse stack is disposed on an upper surface of a damascene conductor containing copper. An insulating diffusion barrier layer covers an upper surface of the damascene conductor that is not covered by the antifuse stack. This insulating diffusion barrier layer inhibits copper from diffusing up into an interlayer dielectric and then laterally into the sidewalls of the antifuse stack. The diffusion barrier layer also covers the sidewalls of the antifuse stack to inhibit contaminants, for example, copper and/or fluorine, chlorine, potassium, sodium ions or the like, from diffusing laterally into the sidewalls of the antifuse stack from the interlayer dielectric. Copper diffuses less readily in the insulating diffusion barrier layer than it does in the interlayer dielectric.

Use of the insulating diffusion barrier layer allows the width of the antifuse stack to be smaller than the underlying damascene trench, which leads to increased packing density and also lower capacitance and leakage.

In an embodiment of an antifuse structure using standard aluminum conductors, an antifuse stack is disposed on an upper surface of a first conductor. Similar to the damascene antifuse structure, an insulating diffusion barrier layer covers a portion of the upper surface of the first conductor not covered by the antifuse stack, and covers the sidewalls of the antifuse stack. The insulating diffusion barrier layer inhibits contaminants from the interlayer dielectric from diffusing into the sidewall of the antifuse stack, which is particularly advantageous where the interlayer dielectric is a "low-k" dielectric and/or contains fluorine, chlorine, or other contaminants, such as mobile potassium and/or sodium ions. The insulating diffusion barrier layer may also cover a top surface of the antifuse stack. The antifuse stack is in electrical contact with a second conductor by a conductor plug that extends through the insulating diffusion barrier.

Another embodiment of an antifuse structure with aluminum conductors uses a conductive plug to place the first conductor in electrical contact with the antifuse stack. The antifuse stack is disposed between the plug and the bottom surface of a second conductor. An insulating diffusion barrier layer covers the sidewalls of the antifuse stack and may extend over the top surface of the second conductor. In another embodiment, the insulating diffusion barrier layer covers the top and sidewalls of the antifuse stack. The second conductor is in electrical contact with the antifuse stack through a via in the insulating diffusion barrier. The insulating diffusion barrier layer again inhibits contaminants from an interlayer dielectric and/or passivation layer from diffusing into the sidewall of the antifuse.

This summary does not purport to define the invention. The invention is defined by the claims.

DETAILED DESCRIPTION

In applications including field programmable gate array applications, numerous antifuses are often disposed along an underlying conductor at the locations where overlying conductors cross the underlying conductor.

Figure 3:
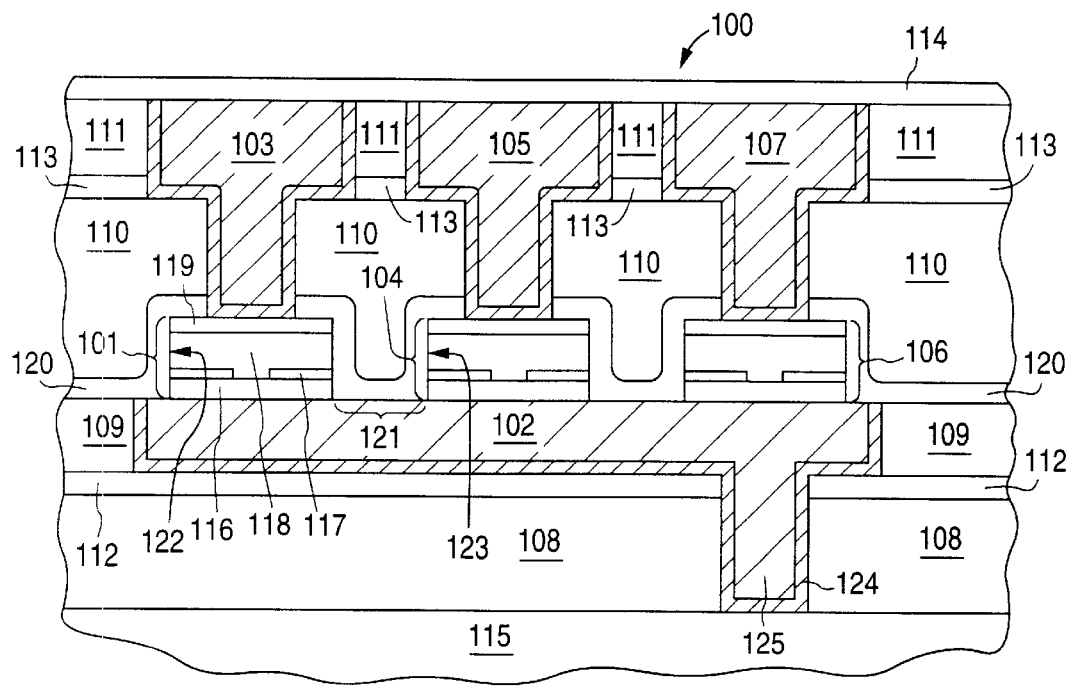
FIG. 3 is a simplified cross-sectional diagram of an antifuse structure of an embodiment in accordance with the invention.

FIG. 3 is a simplified cross-sectional diagram of an antifuse structure 100 in accordance with an embodiment of the present invention. Antifuse 101 is disposed at the location where laterally extending damascene conductor 102 crosses under the overlying perpendicularly extending damascene conductor 103. In a similar fashion, antifuse 104 is disposed at the location where conductor 102 crosses under damascene conductor 105 and antifuse 106 is disposed at the location where damascene conductor 102 crosses under damascene conductor 107. Layers 108–111 are layers of an interlayer dielectric material (for example, TEOS or a "low-k" dielectric). Layers 112–114 are layers of an insulating material, for example, silicon nitride. The structure is fabricated on a substrate 115, which may include substrate silicon, multiple layers of circuitry and/or multiple layers of interconnect.

While each antifuse shown in FIG. 3 is an antifuse stack of multiple layers of material, including barrier metal layers and programmable material, the term "antifuse" will be used herein to refer to both an antifuse stack of multiple layers as well as a single layer antifuse for the sake of simplicity. Each of the antifuses (for example, antifuse 101) includes a bottom barrier metal layer, which acts as a diffusion barrier for the underlying copper (for example, layer 116), a layer of programmable material (for example, layer 118), and an upper barrier metal layer which serves as an etch-stop to protect the programmable material during the etching process used in forming the overlying conductor (for example, layer 119).

Also shown in FIG. 3 is an optional capacitance-reducing insulating layer with a window or opening ("window layer" 117). To program an antifuse, a sufficiently high programming voltage Vpp is placed across the antifuse such that a conductive filament forms through the programmable material layer 118 from one barrier metal layer to the other barrier metal layer. In the programmed state, an antifuse is a low resistance connection between its associated conductors. In the unprogrammed state, the antifuse has a high resistance and the associated conductors are not connected.

To prevent contaminants, for example, impurities in the interlayer dielectric and/or copper from the interconnect metal, from diffusing into the programmable material layers of the antifuses, an insulating diffusion barrier layer 120 is provided. Diffusion barrier 120 covers those. portions (for example, portion 121) of the upper surface of damascene conductor 102 that are not covered by antifuses so that copper will not be able to readily diffuse up into the interlayer dielectric layer 110. Diffusion barrier 120 also covers the sidewalls (for example, sidewall 122) of the antifuses to inhibit unwanted diffusion of impurities into the antifuses from the interlayer dielectric layer 110. In one embodiment, the diffusion barrier 120 is a relatively thin layer of silicon nitride, that extends from one antifuse (for example, antifuse 101) to an adjacent antifuse (for example, antifuse 104) to cover the intervening portion 121 of the upper surface of damascene conductor 102, and then extends up the sidewall (for example, sidewall 123) of the adjacent antifuse to cover the sidewall, and then extends laterally across a portion of an upper surface of the adjacent antifuse to a conductor (for example, conductor 105) that contacts the upper barrier metal layer of the adjacent antifuse.

As discussed above, diffusion barrier 120 covers portions of the upper surface of damascene conductor 102 that are not covered by the antifuses themselves, for example, intervening portion 121. Consequently, the antifuses may be small relative to the underlying damascene trench, resulting in increased packing density and lower capacitance and leakage.

In this embodiment, each of the damascene conductors 102, 103, 105 and 107 includes a central copper portion and a relatively thin barrier metal layer portion. The central copper portion has a copper concentration greater than ten percent by weight and is preferably pure copper. The barrier metal layer portion inhibits diffusion of copper from the central portion to the interlayer dielectric layers. For example, conductor 102 includes a barrier metal portion 124 (for example, titanium nitride, titanium tungsten, tungsten nitride, or tantalum nitride) that lines the inside walls of the trench in which conductor 102 is disposed so that copper from central portion 125 does not diffuse out into interlayer dielectric layers 108 and 109.

FIGS. 4–16 are simplified cross-sectional diagrams that illustrate a method of fabricating antifuse structure 100 in accordance with an embodiment of the present invention. First, a first interlayer dielectric layer 108 is deposited on substrate 115. First interlayer dielectric layer 108 may, for example, be a layer about one micron thick of TEOS or a "low-k" material. The term "low-k" describes a class of materials that have dielectric constants of less than 4.0 and preferably equal to or less than 3.5. Layer 108 may be spun-on or deposited using high density plasma enhanced chemical vapor deposition (HDPE-CVD) or plasma enhanced chemical vapor deposition (PECVD).

Next, a relatively thin insulating etch-stop layer 112 is deposited. Insulating layer 112 may, for example, be a layer of silicon nitride ($SiN_x$) that is approximately 100 to 1000 angstroms thick, e.g., 200 angstroms, and is deposited by PECVD or HDPE-CVD.

Figure 1:
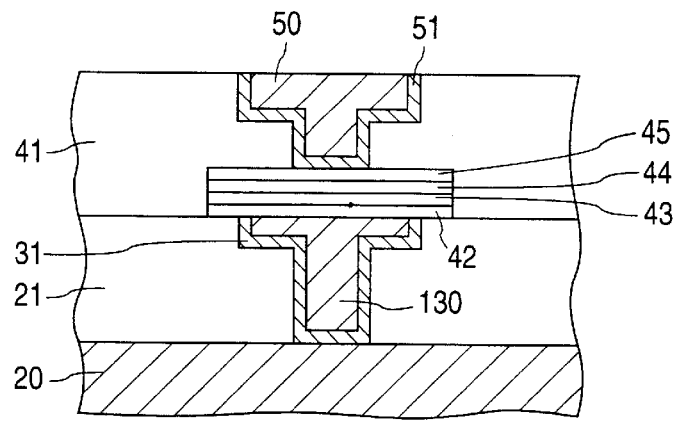
FIGS. 1 and 2(Prior Art) are cross-sectional diagrams of an antifuse structure set forth in U.S. Pat. No. 5,602,053.
Figure 2:
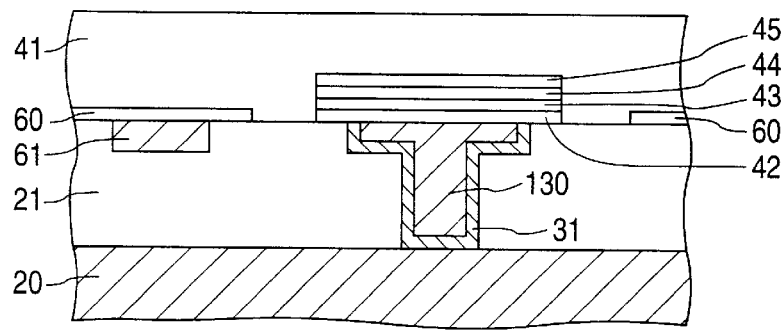
Figure 4:
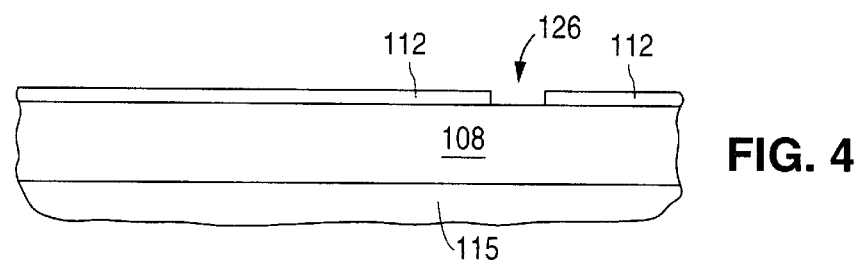
FIGS. 4–16 illustrate methods of making the antifuse structure of FIG. 3.

Next, a photomask is formed over insulating layer 112 and an etching step is performed to form an opening 126 in insulating layer 112. Opening 126 defines the trench for the vertically extending conductive-plug portion of dual damascene conductor 102. Reactive ion etching (RIE) dry etching may be used. FIG. 4 illustrates the resulting structure.

Next, a second interlayer dielectric layer 109 is formed over insulating layer 112. This second interlayer dielectric layer 109 may be about one micron thick and may be deposited in the same fashion that interlayer dielectric layer 108 was deposited.

Figure 5:
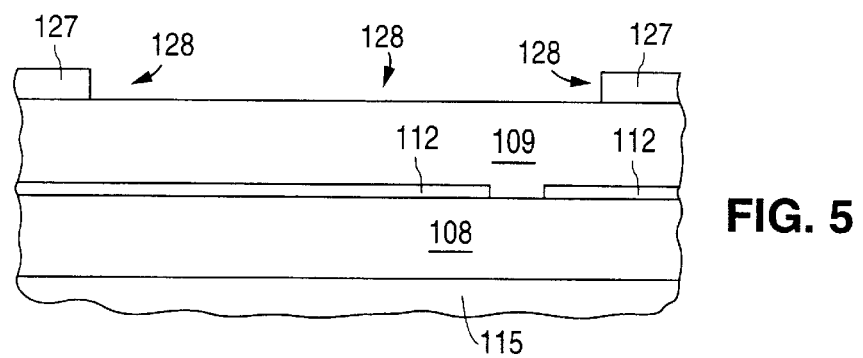

Next, a photomask 127 is formed over the top surface of second interlayer dielectric layer 108. An opening 128 in photomask 127 defines the boundary of a trench for the laterally extending portion of dual damascene conductor 102. The resulting structure is illustrated in FIG. 5.

Figure 6:
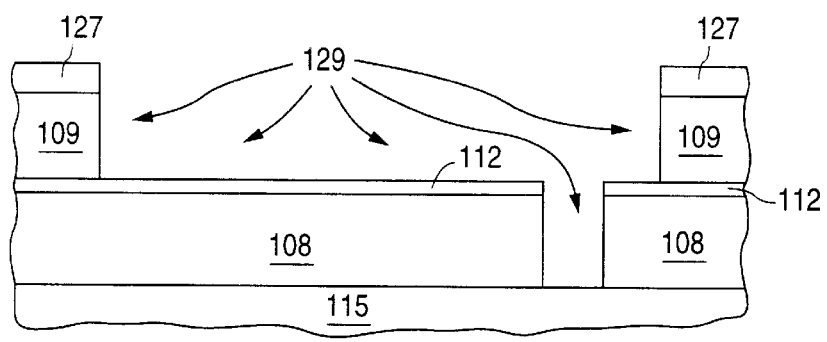

Next, an etching step is performed with insulating layer 112 and layer 115 acting as etch-stop layers. Reactive ion etching can be used. The resulting trench 129 is illustrated in FIG. 6. Photomask 127 is then removed, for example, in an oxygen plasma ashing resist strip step.

Next, barrier layer 124 is formed so that it lines the inside walls of trench 129. Barrier layer 124 may, for example, be a barrier metal layer approximately 100 to 1000 angstroms thick, e.g., 500 angstroms, that is blanket deposited by sputtering or CVD. Suitable barrier metals include titanium nitride, titanium tungsten, tungsten nitride, and tantalum nitride.

Figure 7:
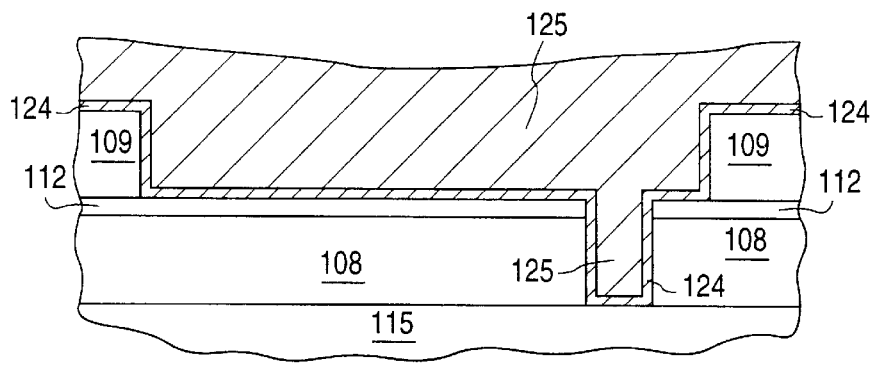

Next, a seed layer of copper (not shown) is deposited within trench 129 and the central copper portion of damascene conductor 102 in accordance with damascene processing techniques. This copper seed layer, for example, may be a layer approximately 100 to 1000 angstroms thick, e.g., 500 angstroms, of relatively pure copper that is either sputter deposited or CVD deposited. Next, the remainder of central copper portion 125 of damascene conductor 102 and the trench 129 is deposited on the seed layer. An electroplating process in accordance with damascene processing techniques can be employed whereby the entire upper surface of the wafer is a cathode in a bath of a copper-containing solution. Copper from a pure copper anode dissolves into the solution and is then electroplated onto the wafer to form central copper portion 125. Alternatively, the entire trench 129 and the central copper portion 125 of damascene conductor 102 can be filled with copper that is CVD deposited. FIG. 7 illustrates the resulting structure.

Figure 8:
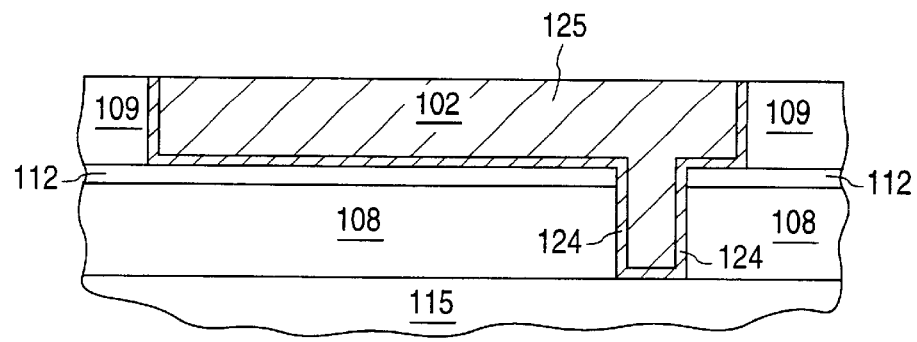

Next, the copper and barrier metal of barrier layer 124 that are not in trench 129 are removed. In one embodiment, chemical mechanical polishing (CMP) is used with a slurry designed to polish copper. Tools such as an Applied Materials "Mirra" CMP machine or an IPEC "Westek" CMP machine can be used. The polishing process is stopped at the top of the second interlayer dielectric layer 109. FIG. 8 illustrates the resulting dual damascene conductor 102 disposed in trench 129.

Next, a barrier metal layer 130A is deposited. Barrier layer 130A may, for example, be a layer between approximately 100 and 2000 angstroms thick, e.g., 1000 angstroms, of sputter deposited or CVD deposited tungsten nitride, titanium nitride, titanium tungsten, or tantalum nitride. Barrier metal layer 130A inhibits both copper from diffusing from conductor 102 into the programmable material layer of the antifuses and the programmable material layer of the antifuses from diffusing into the copper of conductor 102. Metal of the barrier metal layer may also form part of a conductive filament through the programmable material layer in a programmed antifuse.

Figure 9:
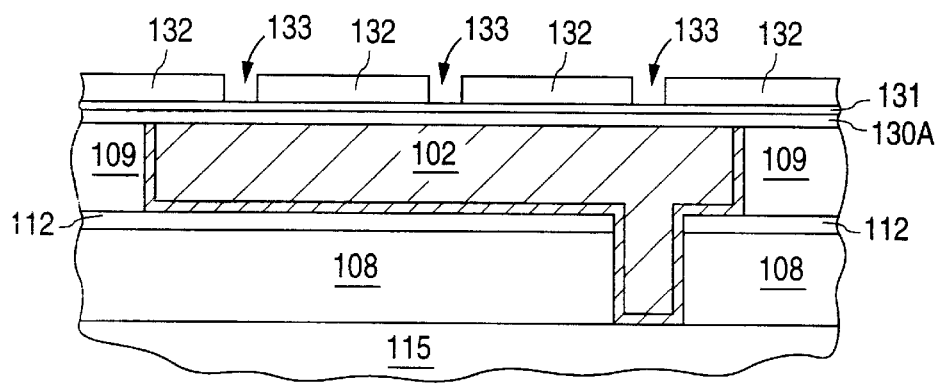

Next, a capacitance-reducing insulation window layer 131 is deposited. Window layer 131 may, for example, be a layer of silicon dioxide or silicon nitride having a thickness in the range of 25 to 1000 angstroms, nominally within 50 to 100 angstroms. A photomask 132 is then formed having openings 133. FIG. 9 illustrates the resulting structure. Next, an etching step is performed to form openings 134 in window layer 131 and photomask 132 is removed in an RIE dry etch photoresist strip step.

It should be understood that the capacitance-reducing insulation window layer 131 may be omitted if desired without adversely affecting diffusion barrier properties. The insulation window layer 131 is advantageous because it reduces the effective area of the antifuse structure, which reduces the capacitance of the antifuse structure. Further, by reducing the effective area of the antifuse structure, the capacitance-reducing insulation window layer 131 results in a higher resistance and therefore lower leakage of the unprogrammed antifuse. In addition, it should be understood that the insulation window layer 131 may be formed at the top portion of the antifuse structure, i.e., between layers 118 and 119 as shown in FIG. 3, in the same manner.

Next, programmable material layer 135 is formed. Programmable material layer 135 may, for example, be a layer approximately 200 to 1500 angstroms thick, nominally 500 angstroms, of intrinsic (undoped) amorphous silicon that is PECVD deposited using, for example, an Applied Materials AMP 5000 machine. The amorphous silicon can be deposited using a conventional two step process, one step having a low deposition rate, while the other step has a higher deposition rate. of course, if desired, and depending on the desired thickness of the layer to be deposited, a one step deposition process may be used. The programmable material contacts the first barrier metal layer 130A through the openings 134.

Next, a second barrier metal layer 136 is deposited. Second barrier metal layer 136, for example, may be a layer between 100 and 2000 angstroms thick, e.g., 1000 angstroms, that is deposited in similar fashion to the way first barrier metal layer 130A was deposited. Second barrier metal layer 136, for example, may be a layer of tungsten nitride, titanium nitride, titanium tungsten, or tantalum nitride. Second barrier metal layer 136 acts as an etch-stop layer to protect the programmable material from the etching process used in forming the overlying damascene conductor. Further, layer 136 acts as a diffusion barrier between the copper in the overlying damascene conductor and the programmable material layer 135. Metal from the second barrier metal layer 136 also acts as part of the programmable material in the antifuse structure.

Figure 10:
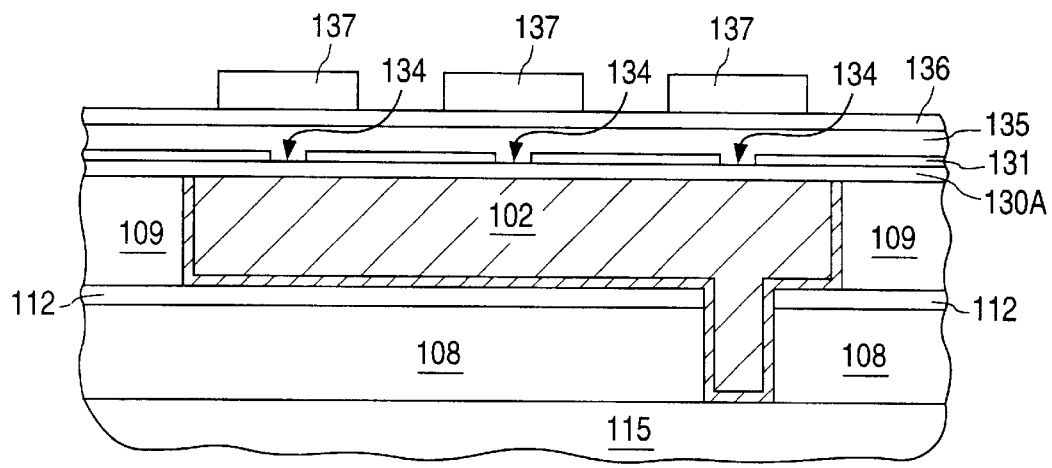

Next, a photomask 137 is formed to protect portions of layers 130A, 131, 135 and 136 where antifuses are to be formed. FIG. 10 illustrates the resulting structure.

Figure 11:
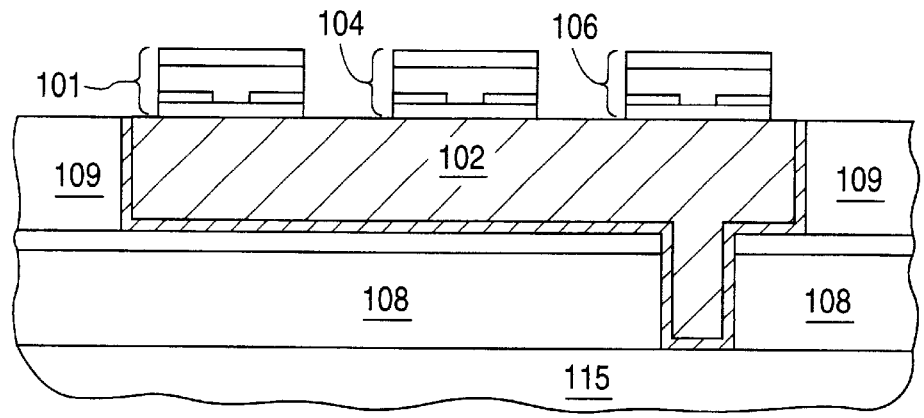

Next, an etching step is performed to form antifuse 101, 104 and 106 on the upper surface of damascene conductor 102. This etching may, for example, be an RIE dry etch. An oxygen plasma ashing photoresist strip step is then performed to remove photomask 137. FIG. 11 illustrates the resulting structure. It should be noted that antifuses 101, 104, and 106 are comprised of stacks of barrier metal layers and programmable material and, thus, may be considered "antifuse stacks."

Figure 12:
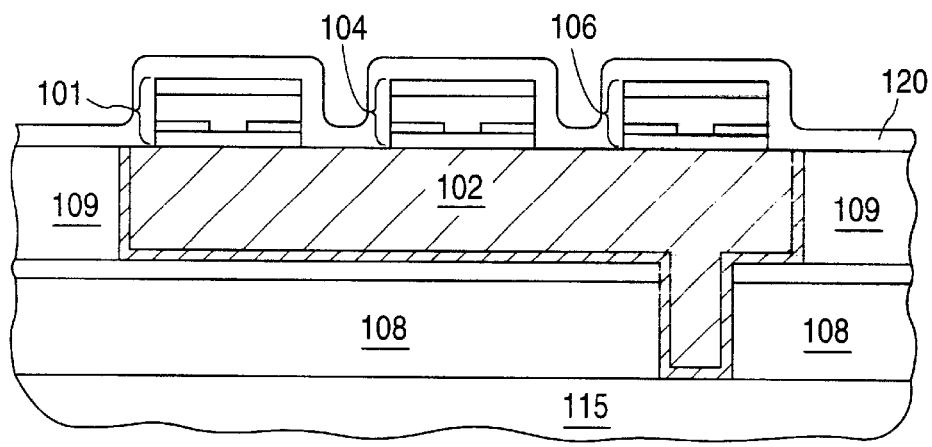
Figure 13:
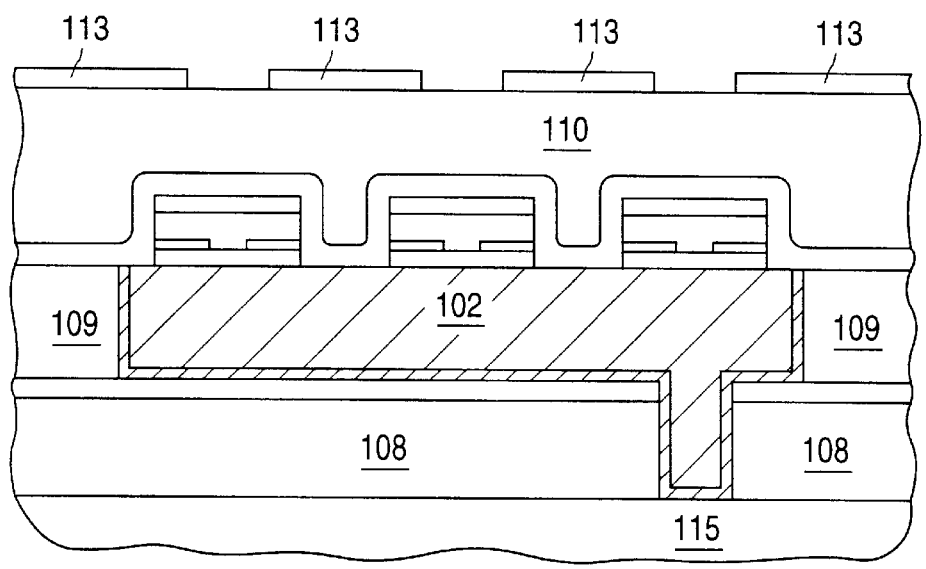

Next, insulating diffusion barrier layer 120 is formed over antifuses 101, 104 and 106 so that it covers the portions of the upper surface of damascene conductor 102 that are not covered with antifuses. Diffusion barrier layer 120 also covers the sidewalls of the antifuses 101, 104 and 106. Diffusion barrier layer 120 may, for example, be a layer between approximately 250 and 1000 angstroms thick, e.g., 500 angstroms, of PECVD deposited silicon nitride. In other embodiments, other materials may be used that suitably inhibit diffusion of unwanted contaminants into the antifuses. These contaminants can originate in conductor 102 and/or interlayer dielectric layer 110. In some embodiments where the interlayer dielectric is a "low-k" dielectric of fluorine and/or chlorine containing polymers, diffusion barrier layer 120 inhibits diffusion of contaminants, including mobile fluorine, chlorine, sodium, and/or potassium ions, into the sidewall of the programmable material of the antifuses from the interlayer dielectric layer 110. In some embodiments, where the damascene conductor is a copper conductor, diffusion barrier layer 120 inhibits diffusion of copper from conductor 102 into the interlayer dielectric layer 110 and/or the antifuses. FIG. 12 illustrates the resulting structure.

Although the upper surface of diffusion barrier layer 120 is conformal with the underlying surface in the embodiment of FIG. 12, it is to be understood that the top surface of diffusion barrier layer 120 need not be so. The top surface of diffusion barrier layer 120 could, for example, be a substantially planar surface disposed in a plane over the upper surface of the second barrier metal layers of the antifuses.

Next, a third interlayer dielectric layer 110 is deposited. Third interlayer dielectric layer 110 may, for example, be a layer of TEOS or "low-k" dielectric having a thickness of approximately two microns. This third interlayer dielectric layer 110 is then planarized. Chemical mechanical polishing (CMP) can be used to polish layer 110 to a thickness of approximately one micron. It should be understood that third interlayer dielectric layer 110 may be comprised of several layers, for example, of different materials that may be used, among other reasons, for stress relief.

Processing then proceeds in similar fashion to the processing illustrated in FIGS. 4–8. Insulating etch-stop layer 113 is deposited and etched to result in the structure illustrated in FIG. 13. Insulating etch-stop layer 113 may, for example, be a layer of silicon nitride having a thickness of approximately 100–1000 angstroms, e.g., 200 angstroms.

Figure 14:
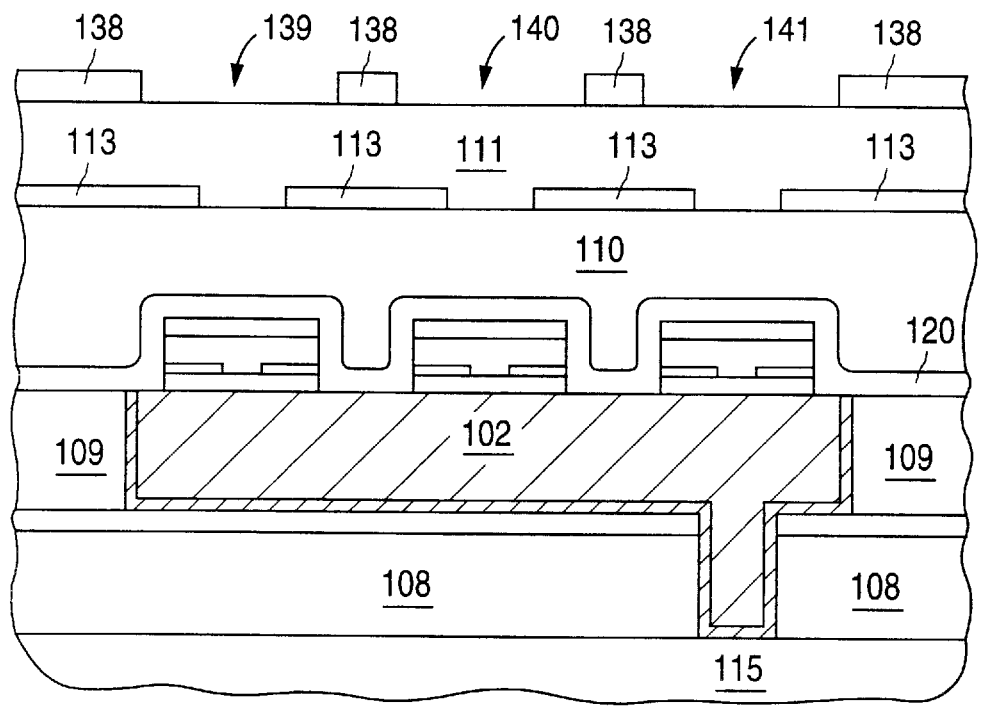

Next, fourth interlayer dielectric layer 111 is deposited and a photomask 138 is formed in similar fashion to the formation of layer 109 and photomask 127. The openings 139, 140 and 141 in photomask 138 are for forming the trenches for damascene conductors 103, 105 and 107, respectively. FIG. 14 illustrates the resulting structure.

Figure 15:
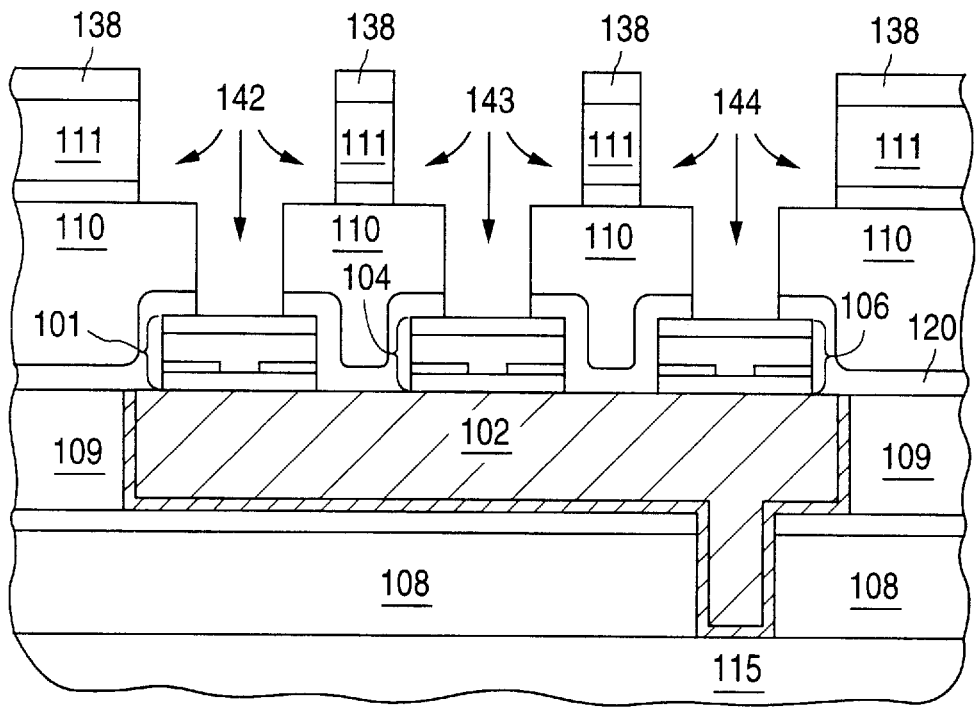

Next, an etching step is performed to form trenches 142, 143 and 144 for damascene conductors 103, 105 and 107, respectively. First an oxide etch is performed. This is followed by an etching step that etches through barrier layer 120 as well as layer 113. FIG. 15 illustrates the resulting structure. Note that the trenches 142, 143 and 144 extend through diffusion barrier layer 120 down to an upper surface of antifuses 101, 104 and 106.

Figure 16:
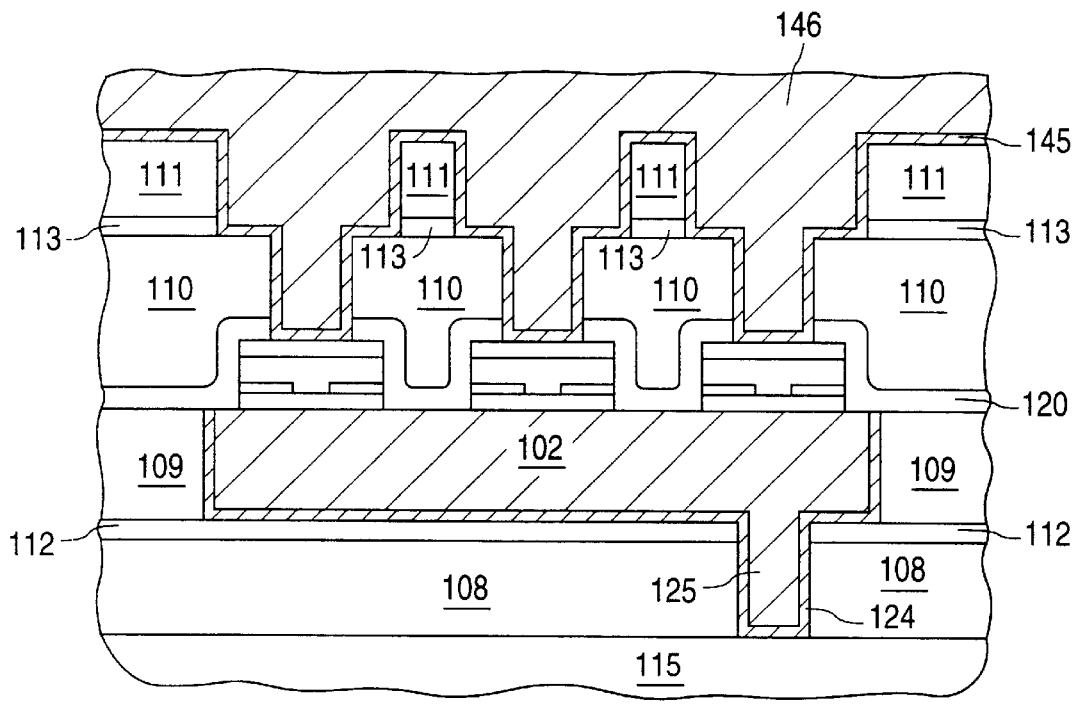

Next, a barrier metal layer 145 is formed, a copper seed layer is formed, and a central portion of copper 146 is formed in the same way that layer 124 and central portion 125 of FIG. 7 are formed. FIG. 16 illustrates the resulting structure.

Next, the copper and barrier metal that is not in trenches 142, 143 and 144 is removed. Chemical mechanical polishing can be used as set forth above in connection with FIG. 8. The result is dual damascene conductors 103, 105 and 107. A diffusion barrier layer 114 is then formed over the upper surface of conductors 103, 105 and 107 to prevent copper from these conductors from diffusing into overlying layers. Diffusion barrier layer 114 may, for example, be a layer of silicon nitride having a thickness of approximately 200 angstroms. Of course, additional circuitry structures or a passivation layer (not shown) may be deposited over barrier layer 114. FIG. 3 illustrates the resulting structure.

It should be understood that the specific dual damascene approach disclosed herein is exemplary and that other damascene approaches may be used without departing from the scope of the present invention.

For additional information on copper interconnect technology and damascene processing, see the following documents: "Interconnect Metallization For Future Device Generations", by Bruce Roberts et al., Solid State Technology, starting at page 69 (February 1995); "Interconnect Fabrication Processes And The Development Of Low-Cost Wiring For CMOS Products", by T. J. Licata et al., IBM Journal of Research and Development, vol. 39, no. 4, starting at page 419 (July 1995); "Processing And Integration Of Copper Interconnects", by Robert L. Jackson et al., Solid State Technology, starting at page 49 (March 1998); and "Integration Challenges Of Ultra Low-K Dielectrics", by S. W. Russel et al. The entirety of the subject matter of the above-listed documents is expressly incorporated herein by reference.

Figure 17:
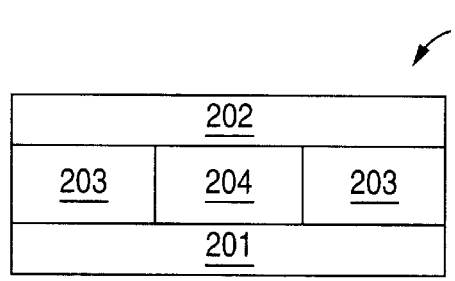
FIG. 17 is a simplified cross-sectional diagram of another antifuse structure.

FIG. 17 is a simplified cross-sectional diagram of an antifuse structure 200 used in certain embodiments of the present invention. Antifuse structure 200 includes a lower barrier metal layer 201, an upper barrier metal layer 202, and an insulating capacitance-reducing window layer 203 similar to barrier metal layers 116 and 119 and window layer 117 of FIG. 3. In the embodiment of FIG. 17, a layer of programmable material is deposited to cover the surface of window layer 203 so that it also fills the opening in window layer 203. Prior to the formation of upper barrier metal layer 202, the programmable material layer is planarized (for example, by etching or chemical mechanical polishing) so that all the programmable material is removed except that in the opening. The result is a plug 204 of programmable material. After formation of plug 204, the upper barrier metal layer 202 is formed as in the embodiment of FIG. 3.

Figure 18:
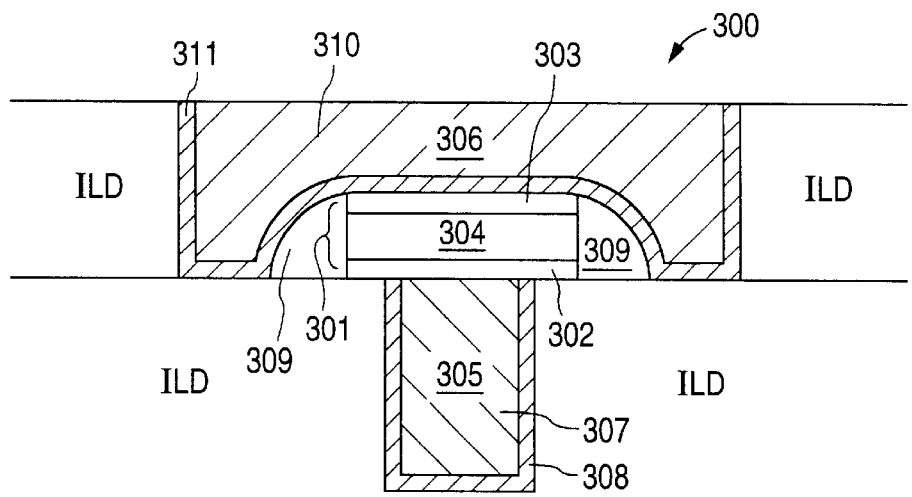
FIG. 18 is a simplified cross-sectional diagram of an antifuse structure of another embodiment in accordance with the invention.

FIG. 18 is a cross-sectional diagram of an antifuse structure 300 in accordance with another embodiment. An antifuse 301 including a lower barrier metal layer 302, an upper barrier metal layer 303 and an intervening programmable material layer 364 is disposed between a lower conductor 305 and an upper conductor 306. Lower conductor 305 is a conductive-plug with a copper central portion 307 and an outer portion 308 that is a barrier metal layer (for example, tungsten nitride, titanium nitride, titanium tungsten, or tantalum nitride). Lower barrier metal layer 302 is used to prevent diffusion of copper into the programmable material 304. In some embodiments, lower conductor 305 is a conductive-plug of tungsten wherein the central portion 307 is of tungsten and an outer portion 308 is an adhesion layer (for example, titanium and/or titanium nitride). When the lower conductor 305 is a tungsten-plug and the underlying interlayer dielectric layer is not a "low-k" dielectric, lower barrier metal layer 302 need not be provided.

Upper conductor 306, similar to lower conductor 305, is a damascene conductor involving a central copper portion 310 as well as an outer barrier metal layer 311 that lines the trench containing conductor 306.

As shown in FIG. 18, antifuse structure 300 includes sidewall spacers 309. Sidewall spacers 309 may be silicon nitride or silicon oxide. Sidewall spacers 309 serve as a diffusion barrier preventing contaminants, such as fluorine or chlorine, from diffusing into the sidewall of the programmable material of the antifuses, which is particularly advantageous where the interlayer dielectric is a "low-k" dielectric. This is applicable to not only the above described damascene antifuse architecture, but antifuse architecture using standard aluminum type conductors as well. Further, when lower conductor 305 is copper, lower barrier metal layer 102 is needed and sidewall spacers 309 prevent shorting of the bottom of upper conductor 306 to the lower barrier metal layer 302 of the antifuse.

Figure 19:
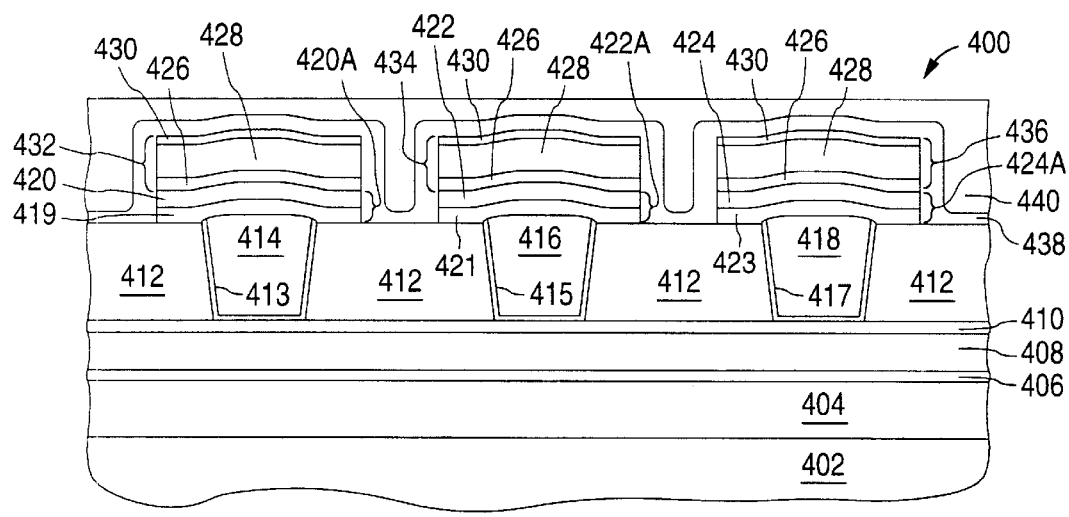
FIG. 19 is a simplified cross-sectional diagram of an antifuse structure of another embodiment in accordance with the invention.

FIG. 19 is a simplified cross-sectional diagram of an antifuse structure 400 using aluminum conductors and a diffusion barrier layer covering the sidewalls of the antifuses in accordance with an embodiment of the present invention.

Layer 402 is an underlying structure which may involve logic circuitry of a field programmable gate array or be connected to such circuitry. Layer 404 is an insulating layer, which may be a "low-k" dielectric or TEOS. Layer 406 is a first barrier metal layer, such as titanium nitride. Layer 408 is an aluminum (for example, AlSiCu) layer that serves as a conductor and is disposed on the first barrier metal layer 406. Layer 410 is a second barrier layer, such as titanium nitride, which can also be used as an anti-reflective coating.

The interlayer dielectric layer 412 shown in FIG. 19 is a "low-k" dielectric, for example, of fluorine or chlorine containing polymers. Conductive plugs 414, 416, and 418 are shown disposed within interlayer dielectric layer 412. Conductive plugs 414, 416, and 418 may be, for example, tungsten with respective adhesion layers 413, 415, and 417, of titanium nitride.

Overlying conductive plugs 414, 416, 418 are barrier layers 419, 421, and 423 and programmable material layers 420, 422, and 424, respectively, forming antifuses 420A, 422A, and 424A. Barrier layers 419, 421, and 423 are, by way of example, titanium nitride. The antifuse programmable material may include one or more layers of antifuse dielectric material including amorphous silicon, polysilicon, silicon nitride and silicon dioxide. Dopants and other materials such as hydrogen are added in particular embodiments.

Conductors 432, 434, and 436, which are metal stacks including a barrier layer 426, a conductor layer 428, and another barrier layer 430, are disposed over each antifuse 420A, 422A, and 424A, respectively. Layers 426, 428 and 430 are similar to layers 406, 408, and 410. However, as shown in FIG. 19 conductors 432, 434, and 436 are separate conductors that are positioned orthogonally to layers 406, 408, and 410.

An insulating diffusion barrier layer 438 is provided over conductors 432, 434, and 436 and the interlayer dielectric layer 412. Diffusion barrier 438 also covers the sidewalls of antifuses 420A, 422A, and 423A. In one embodiment, the diffusion barrier 120 is a relatively thin layer of silicon nitride that extends from one antifuse (for example, antifuse 420A) to an adjacent antifuse (for example, antifuse 422A), and extends over the sidewalls of the adjacent antifuse and the top of the conductor covering the adjacent antifuse (for example conductor 434).

An interlayer or passivation dielectric layer 440 is formed over the antifuse structure. Passivation dielectric layer 440 may include several separate layers, such as an insulating "low-k" dielectric layer, an oxynitride passivation layer, a layer of spin on glass, and a layer of silicon nitride. While the present disclosure refers to layer 440 as a passivation dielectric layer, it should be understood that layer 440 may be another interlayer dielectric layer.

"Low-k" dielectric material, such as that used in interlayer dielectric layer 412 and passivation dielectric layer 440 may be for example, fluorine or chlorine containing polymers. Diffusion of impurities from the "low-k" dielectric material into the antifuse material may increase the conductivity of the antifuse material. Thus, diffusion barrier layer 438, along with barrier layers 419, 421, and 423, is used to inhibit unwanted diffusion of impurities from the interlayer dielectric layer 412 and passivation dielectric layer 440 into the antifuse material.

It should be understood, that when a "low-k" dielectric material is not used, it is unnecessary to create a barrier layer between the interlayer dielectric material and the antifuse. Thus, if the interlayer dielectric layer 412 is not a "low-k" dielectric material, but is for example TEOS, the use of barrier layers 419, 421, and 423 would be unnecessary. Nevertheless, the diffusion barrier layer 438 may still be used advantageously to prevent contaminants from diffusing into the sidewalls of the antifuses 420A, 422A, and 424A, where a low-k dielectric material is used in passivation dielectric layer 440 to fill between the conductors 432, 434, and 436.

Figure 20:
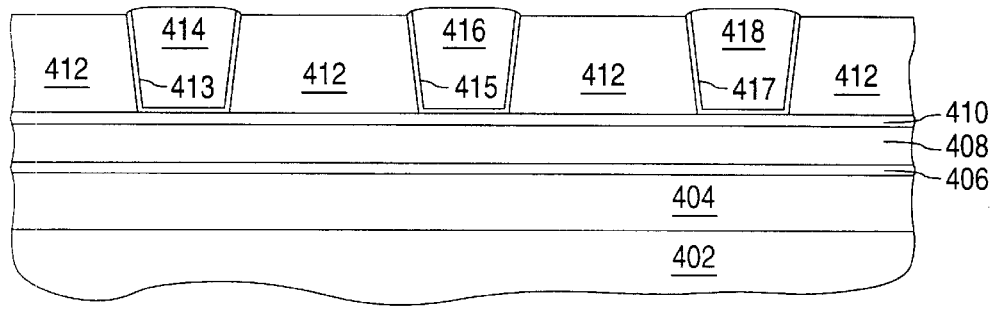
FIGS. 20–22 illustrate methods of making the antifuse structure of FIG. 19.
Figure 21:
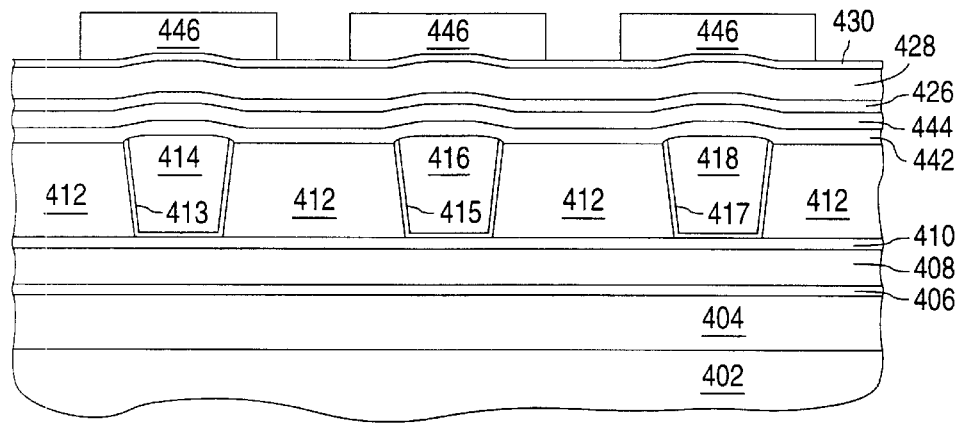
Figure 22:
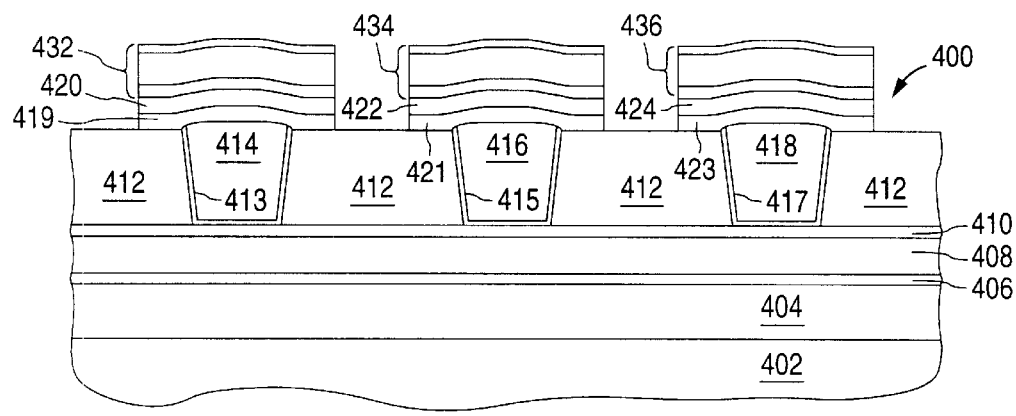

FIGS. 20 through 22 are simplified cross-sectional diagrams that illustrate a method of fabricating antifuse structure 400 in accordance with an embodiment of the present invention. FIG. 20 shows the partially completed antifuse structure of FIG. 19. For details on the fabrication of the structure shown in FIG. 20 see pending U.S. patent application Ser. No. 09/133,998, filed on Aug. 13, 1998, entitled "Metal-To-Metal Antifuse Having Improved Barrier Layer" by Jain et. al., and having the same assignee, the entirety of the contents of which are expressly incorporated herein by reference. Of course, other methods of fabrication of the antifuse structure shown in FIG. 20 may be used, as are well known to those of ordinary skill in the art.

Next, a barrier layer 442 is deposited over the entire wafer. Barrier layer 442 in this embodiment is a 1000 angstrom layer of titanium nitride sputtered onto the wafer with a Centura sputtering machine manufactured by Applied Materials. After forming the titanium nitride layer, a cleaning step is performed in a single wafer high energy deionized water cleaning machine to remove loose particles that may remain after the titanium nitride sputtering. Of course, other barrier materials could be used, including titanium tungsten, titanium, tungsten, tungsten silicide, tantalum nitride, and titanium-tungsten-nitrogen alloys.

A layer 444 of programmable antifuse material is then deposited over the barrier layer 442. In one embodiment, the programmable material layer 444 is a single 700 angstrom layer of hydrogenated intrinsic PECVD amorphous silicon deposited using an Applied Materials AMP500 single chamber PECVD deposition machine. Deposition of the programmable material occurs in two steps. In a first step, deposition occurs for about ten seconds at a relatively slow deposition rate to form a starting layer about 200 angstroms thick. In a second step, deposition occurs at a higher deposition rate for about twelve seconds.

Next, the conductor layer 428 is formed between two barrier metal layers 426 and 430. Barrier metal layer 426 is an approximately 1000 angstrom layer of titanium nitride that is sputtered deposited. Barrier metal layer 426 may be a multi-layer film deposited with air-breaks, as is well known in the art. Conductor layer 428 is formed as a standard sputtered aluminum layer (AlSiCu) approximately 3000–10,000 angstroms thick, e.g., 8000 angstroms, that comprises about two percent copper. The next barrier metal layer 430, may be an anti-reflective coating, and is formed over the conductor layer 428 as a 250 angstrom thick layer of sputter deposited titanium nitride.

Next, a photomask 446 is formed to protect portions of layers 442, 444, 426, 428, and 430, where antifuses and the metal conductors are to be formed. FIG. 21 illustrates the resulting structure.

Next, an etching step is performed to form antifuses 420A, 422A, and 424A along with conductors 432, 434, and 436. This etching may, for example, be an RIE dry etch. An oxygen plasma ashing photoresist strip step is then performed to remove photomask 446. FIG. 22 illustrates the resulting structure.

Insulating diffusion barrier layer 438 is formed over conductors 432, 434, and 436 as well as the sidewalls of antifuses 420A, 422A, and 424A. Diffusion barrier layer 438 may, for example, be a layer between 250 to 1000 angstroms thick, e.g., 500 angstroms, of PECVD deposited silicon nitride. In other embodiments, other materials may be used that suitably inhibit diffusion of unwanted impurities into the antifuses.

Next, an interlayer or passivation dielectric layer 440 is formed over the antifuse structure. In one embodiment, there are several layers in passivation dielectric layer 440 including: a layer of PECVD insulating "low-k" dielectric; a PECVD deposited oxynitride passivation layer; a layer of spin on glass (SOG) that fills spaces between metal conductors; and a layer of PECVD silicon nitride. The bottom insulating "low-k" dielectric layer and oxynitride layer prevent moisture from the subsequent spin on glass formation step from penetrating underlying metal layers and causing corrosion. The spin on glass is cured at a maximum temperature of 420 degrees Celsius. Because the 420 degree Celsius curing step is the highest temperature the hydrogenated amorphous silicon programmable material experiences, the curing step likely controls the removal of hydrogen and density of dangling bonds. Care is taken not to subject the amorphous silicon to a temperature higher than this 420 degrees Celsius. The resulting structure is shown in FIG. 19.

Figure 23:
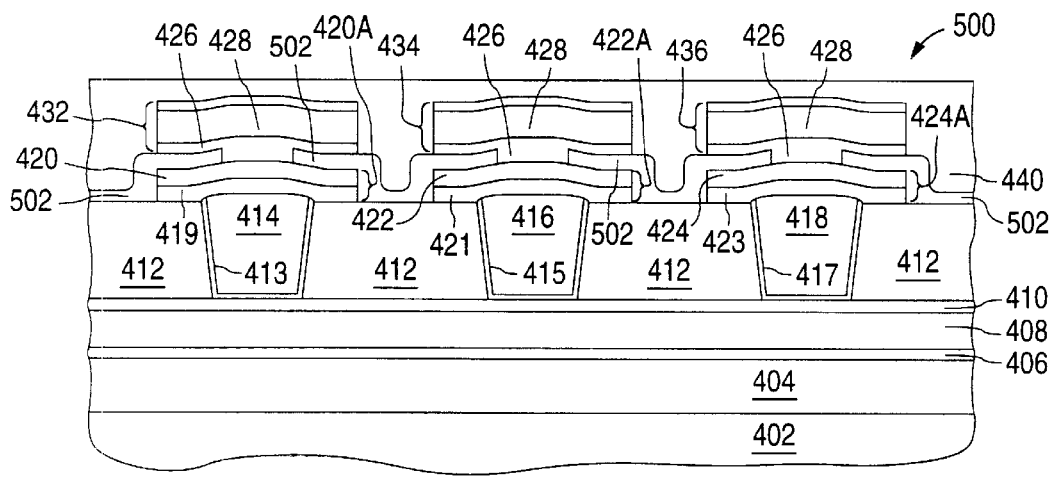
FIG. 23 is a simplified cross-sectional diagram of an antifuse structure of another embodiment in accordance with the invention.

FIG. 23 is a simplified cross-sectional diagram of another antifuse structure 500, which is similar to antifuse structure 400, shown in FIG. 19, like designated elements being the same. However, the diffusion barrier layer 502 does not extend over conductors 432, 434, or 436, but is formed over antifuses 420A, 422A, 424A. Thus, the sidewalls of antifuses 420A, 422A, and 424A are protected from diffusion of contaminants from layer 440 by diffusion barrier layer 502.

The method of fabricating antifuse structure 500 is similar to the method of fabricating antifuse structure 400, as shown in FIGS. 20–22, however, diffusion barrier layer 502 is deposited over antifuses 420A, 422A, and 424A prior to deposition of the layers forming conductors 432, 434, and 436. A photomask is formed over diffusion barrier layer 502 and an etching step is performed to form openings in diffusion barrier layer 502 above each antifuse. Reactive ion etching (RIE) dry etching may be used. In some embodiments, it may be desirable to include an additional barrier metal layer over each programmable material layer 420, 422, 424 to serve as an etch stop. The remaining conductive layers forming conductors 432, 434, and 436 are then deposited and etched. Conductors 432, 434, and 436 are in electrical contact with programmable material layers 420, 422, and 424 (or an overlying barrier metal layer, if used) via the opening formed in diffusion barrier layer 502.

Advantageously, by depositing diffusion barrier layer 502 between antifuses 420A, 422A, 424A and conductors 432, 434, 436, and forming openings in diffusion barrier layer 502, diffusion barrier layer 502 may be used as a capacitance-reducing window, similar to window 117 shown in FIG. 3.

It should be understood that if desired, diffusion barrier layer 502 may be disposed between conductor layer 428 and barrier layer 426. In such an embodiment, antifuses 420A, 422A, and 424A would be defined to include, not only respective barrier layers 419, 421, 423, and programmable antifuse material layers 420, 422, and 424, but also barrier layer 426.

Figure 24:
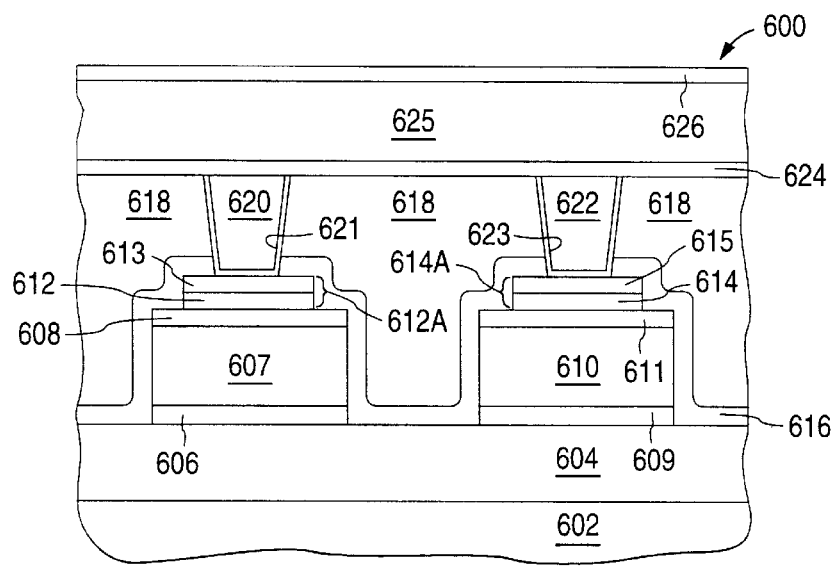
FIG. 24 is a simplified cross-sectional diagram of an antifuse structure of another embodiment in accordance with the invention.

In another embodiment of the present invention, shown in FIG. 24, a diffusion barrier layer is used to prevent diffusion of impurities from an interlayer dielectric layer into the sidewalls of the antifuses when the antifuses are located under the conductive plug.

FIG. 24 shows an antifuse architecture 600, including an underlying structure layer 602 and an insulating layer 604 that may be TEOS or a "low-k" dielectric. Conductors 606–608 and 609–611 are formed as described above with respect to FIG. 21, with metal stacks of barrier layers 606, 608, 609, and 611 formed of sputtered titanium nitride and conductor layers 607 and 610 formed of sputter deposited aluminum (AlSiCu).

Programmable material layers 612 and 614, with overlying barrier layers 613, and 615, are deposited over respective conductors stacks 606–608 and 609–611 to form antifuses 612A and 614A. Programmable material layers 612 and 614 and the overlying barrier layers 613 and 615 may be amorphous silicon and titanium nitride, respectively, as described above with respect to FIG. 21. Overlying barrier layers 613 and 615 act as an etch stop layer and make electrical contact with plugs 620 and 622, respectively. It should be understood that antifuses 612A and 614A may be patterned separately from the patterning of conductors 606–608 and 609–611. Thus, antifuses 612A and 614A may have a smaller cross section than conductors 606–608 and 609–611. If desired, the programmable material layer and barrier layer of antifuses 612A and 614A may be patterned at the same time as conductors 606–608 and 609–611 so that antifuses 612A and 614A have the same cross section as conductors 606–608 and 609–611.

A diffusion barrier layer 616 is then formed over the wafer. Diffusion barrier layer 616 is, for example, a layer between approximately 250 to 1000 angstroms thick, e.g., 500 angstroms, of PECVD deposited silicon nitride. As illustrated in FIG. 24, diffusion barrier layer 616 covers the sidewalls of antifuses 612A and 614A so as to prevent diffusion of unwanted contaminants into the antifuses. In other embodiments, other materials may be used that suitably inhibit diffusion of unwanted impurities into the antifuses.

Interlayer dielectric layer 618 is a "low-k" dielectric material disposed over diffusion barrier layer 616. Conductive plugs 620 and 622, including respective adhesive layers 621 and 623, are disposed in interlayer dielectric layer 618. As can be seen in FIG. 24, the conductive plugs 620 and 622 extend through diffusion barrier layer 616 so as to contact barrier layers 613 and 615, respectively. As described above in reference to FIG. 20 the conductive plugs may be formed of tungsten and the adhesive layer formed of titanium nitride.

Overlying conductive plugs 620, 622 and the interlayer dielectric layer 618 is anothenr conductor 624–626 formed orthogonally to conductors 606–608 and 609–611. Conductor 624–626 is, for example, a stack of a titanium nitride barrier layer 624, an aluminum (AlSiCu) conductor layer 625, and another titanium nitride barrier layer 626.

Although the present invention is described in connection with certain specific embodiments for instructional purposes, the present invention is not limited thereto. Single damascene conductors, dual damascene conductors or both can be employed. Moreover, a combination of damascene conductors (single or dual) and aluminum conductors may be used. Conductive plug technology, including tungsten-plug technology, can be used to realize conductors either above the antifuse or below the antifuse in accordance with certain embodiments. Programmable materials other than amorphous silicon can be employed. Polysilicon, nitride and/or oxide layers can be used as programmable materials. Further, antifuses may contain multiple stacked layers of materials, including barrier metals and programmable materials, or may contain a single layer of programmable material. A capacitance-reducing window layer may be disposed either over or under the programmable material layer, but need not be employed. Further, the diffusion barrier layer may be used as the capacitance-reducing window layer. Materials other than silicon nitride can be employed for diffusion barrier layer, for example, silicon oxide or silicon oxynitride when copper conductors are not used. The diffusion barrier layer need not directly contact the antifuse sidewalls and the upper damascene conductor surface in all embodiments. The diffusion barrier layer may involve multiple layers. Different techniques may be used to form the damascene architecture. For example, multiple techniques for depositing the copper of the damascene conductors can be used, including CVD depositing all the copper without the use of a two step seed layer and electroplating process. Accordingly, various modifications, adaptations, and combinations of various features of the described embodiments can be practiced without departing from the scope of the invention as set forth in the claims.

What is claimed is:

1. An antifuse structure, comprising:
   a first conductor of a first layer of interconnect, the first conductor having a substantially planar upper surface;
   a second conductor of a second layer of interconnect;
   an interlayer dielectric layer disposed at least partly between the first layer of interconnect and the second layer of interconnect;
   an antifuse comprising a programmable material layer, the antifuse being disposed between a first portion of the planar upper surface of the first conductor and the second conductor; and
   an insulating diffusion barrier layer disposed over a plurality of sidewalls of the antifuse, the insulating diffusion barrier layer separating the interlayer dielectric layer from a sidewall of the programmable material layer of the antifuse, the antifuse structure being programmable to couple the first conductor to the second conductor.

2. The antifuse structure of claim 1, further comprising a conductive plug disposed between the antifuse and the second conductor, wherein the antifuse is disposed on the first portion of the planar upper surface of the first conductor.

3. The antifuse structure of claim 2, wherein the insulating diffusion barrier layer is also disposed over a second portion of the planar upper surface of the first conductor, the insulating diffusion barrier is a layer that extends from the second portion of the upper surface of the first conductor, up a sidewall of the antifuse, and over a portion of an upper surface of the antifuse, the insulating diffusion barrier layer contacting the conductive plug.

4. The antifuse structure of claim 1, further comprising a conductive plug disposed between the first portion of the planar upper surface of the first conductor and the antifuse, wherein the antifuse is disposed on a portion of a substantially planar top surface of the conductive plug and is in contact with the bottom surface of the second conductor.

5. The antifuse structure of claim 4, wherein the insulating diffusion barrier layer is also disposed over a sidewall of the second conductor, the insulating diffusion barrier being a layer that extends from a portion of an upper surface of the second conductor and down a sidewall of the antifuse.

6. The antifuse structure of claim 1, wherein at least one of the first conductor and the second conductor comprises aluminum.

7. The antifuse structure of claim 1, wherein:
   at least one of the first conductor and the second conductor is a damascene conductor at least a portion of which has a copper concentration greater than ten percent by weight;
   the antifuse being disposed on the first portion of the planar upper surface of the first conductor; and
   the insulating diffusion barrier layer is also disposed over a second portion of the planar upper surface of the first conductor.

8. The antifuse structure of claim 7, wherein the insulating diffusion barrier layer is also disposed over a second portion of the planar upper surface of the first conductor, the insulating diffusion barrier is a layer that extends from the second portion of the upper surface of the first conductor, up a sidewall of the antifuse, and over a portion of an upper surface of the antifuse.

9. The antifuse structure of claim 1, the antifuse further comprising:
   a barrier metal layer, a bottom surface of the barrier metal layer being in contact with an upper surface of the programmable material layer.

10. The antifuse structure of claim 9, the antifuse further comprising:

a second barrier metal layer, a planar bottom surface of the second barrier metal layer being in contact with the first portion of the upper surface of the first conductor, at least a portion of a planar upper surface of the second barrier metal layer being in contact with a portion of the programmable material layer.

11. The antifuse structure of claim 7, wherein the antifuse comprises:

a first metal layer;

a second metal layer;

an insulating layer having an opening; and the programmable material layer, the insulating layer and the programmable material layer being disposed between the first metal layer and the second metal layer, the programmable material layer being in contact with one of the first metal layer and the second metal layer through the opening.

12. The antifuse structure of claim 1, wherein the insulating diffusion barrier layer comprises one of at least silicon nitride and silicon oxynitride, and wherein the interlayer dielectric layer is not silicon nitride.

13. The antifuse structure of claim 1, wherein the programmable material layer is a layer of amorphous silicon.

14. The antifuse structure of claim 1, further comprising a passivation layer, wherein at least one of the interlayer dielectric layer and passivation layer contains at least one of fluorine and chlorine and has a dielectric constant of four or less.

15. The antifuse structure of claim 1, further comprising a passivation layer, wherein at least one of the interlayer dielectric layer and passivation layer is a low-k dielectric.

16. The antifuse structure of claim 1, the first conductor further comprising:

a barrier layer, the barrier layer comprising at least one element taken from the group consisting of: tungsten, titanium and tantalum.

17. The antifuse structure of claim 16, wherein the insulating diffusion barrier layer contacts a barrier layer of the second conductor.

18. The antifuse structure of claim 1, further comprising:

a second antifuse, the second antifuse being disposed between a third portion of the planar upper surface of the first conductor and the second conductor, the insulating diffusion barrier layer extending on a second portion of the planar upper surface of the first conductor from the second antifuse to a first antifuse.

19. An antifuse structure, comprising:

a first conductor, the first conductor having a substantially planar upper surface;

a second conductor;

an interlayer dielectric layer;

a first antifuse comprising a programmable material layer, the first antifuse being disposed between a first portion of the planar upper surface of the first conductor and the second conductor;

a second antifuse comprising a programmable material layer, the second antifuse being disposed between a second portion of the planar upper surface of the first conductor and the second conductor; and means for inhibiting diffusion of a contaminant into the first and second antifuses from the interlayer dielectric layer, the means comprising a layer of an insulating material disposed on the sides of the first and second antifuses, the antifuse structure being programmable to couple the first conductor to the second conductor.

20. The antifuse structure of claim 19, the contaminant being one of copper, fluorine, chlorine, sodium and potassium and moisture.

21. The antifuse structure of claim 19, wherein:

at least one of the first conductor and the second conductor is a damascene conductor with at least a portion of which has a copper concentration greater than ten percent by weight;

the first antifuse being disposed on the first portion of the planar upper surface of the first conductor;

the second antifuse being disposed on a second portion of the planar upper surface of the first conductor; and the insulating material is disposed on a third portion of the planar upper surface of the first conductor and extends from the first antifuse to the second antifuse.

* * * * *